United States Patent
Ward et al.

(10) Patent No.: US 9,303,190 B2
(45) Date of Patent: Apr. 5, 2016

(54) MIXED ABRASIVE TUNGSTEN CMP COMPOSITION

(71) Applicant: Cabot Microelectronics Corporation, Aurora, IL (US)

(72) Inventors: William Ward, Glen Ellyn, IL (US); Glenn Whitener, Batavia, IL (US); Steven Grumbine, Aurora, IL (US); Jeffrey Dysard, St. Charles, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 4 days.

(21) Appl. No.: 14/222,736

(22) Filed: Mar. 24, 2014

(65) Prior Publication Data

US 2015/0267083 A1   Sep. 24, 2015

(51) Int. Cl.
| | |
|---|---|
| C09G 1/00 | (2006.01) |
| C09G 1/02 | (2006.01) |
| H01L 21/321 | (2006.01) |
| C09G 1/04 | (2006.01) |
| H01L 21/306 | (2006.01) |

(52) U.S. Cl.
CPC .. *C09G 1/02* (2013.01); *C09G 1/04* (2013.01); *H01L 21/30625* (2013.01); *H01L 21/3212* (2013.01)

(58) Field of Classification Search
CPC .. C09K 3/1436; C09K 3/1463; C09K 3/1454; C09G 1/02; C09G 1/04; H01L 21/30625; H01L 21/3212
See application file for complete search history.

(56) References Cited

U.S. PATENT DOCUMENTS

| | | |
|---|---|---|
| 5,230,833 A | 7/1993 | Romberger et al. |
| 5,942,015 A | 8/1999 | Culler et al. |
| 5,958,288 A | 9/1999 | Mueller et al. |
| 5,980,775 A | 11/1999 | Grumbine et al. |
| 6,083,419 A | 7/2000 | Grumbine et al. |
| 6,136,711 A | 10/2000 | Grumbine et al. |

(Continued)

FOREIGN PATENT DOCUMENTS

KR   1020050073044 A   7/2005

OTHER PUBLICATIONS

Korean Intellectual Property Office as International Searching Authority, The International Search Report and The Written Opinion of the International Searching Authority, issued in connection with Patent Application No. PCT/US2015/021674 on Jul. 17, 2015.

*Primary Examiner* — Duy Deo
(74) *Attorney, Agent, or Firm* — Thomas Omholt; Arlene Hornilla; Christopher C. Streinz

(57) ABSTRACT

A chemical mechanical polishing composition for polishing a substrate having a tungsten layer includes a water based liquid carrier, first and second colloidal silica abrasives dispersed in the liquid carrier, and an iron containing accelerator. The first colloidal silica abrasive and the second colloidal silica abrasive each have a permanent positive charge of at least 10 mV. An average particle size of the second silica abrasive is at least 20 nanometers greater than an average particle size of the first silica abrasive. A method for chemical mechanical polishing a substrate including a tungsten layer is further disclosed. The method may include contacting the substrate with the above described polishing composition, moving the polishing composition relative to the substrate, and abrading the substrate to remove a portion of the tungsten from the substrate and thereby polish the substrate.

17 Claims, 1 Drawing Sheet

(56) References Cited

U.S. PATENT DOCUMENTS

| | | | |
|---|---|---|---|
| 6,334,880 B1 | 1/2002 | Nergrych et al. |
| 6,582,623 B1 | 6/2003 | Grumbine et al. |
| 6,646,348 B1 | 11/2003 | Grumbine et al. |
| 6,656,241 B1 | 12/2003 | Hellring et al. |
| 6,676,719 B2 | 1/2004 | Lortz et al. |
| 6,750,257 B2 | 6/2004 | Matsumura et al. |
| 6,776,810 B1 | 8/2004 | Cherian et al. |
| 6,896,591 B2 | 5/2005 | Chaneyalew et al. |
| 6,930,054 B2 | 8/2005 | Lee et al. |
| 7,018,560 B2 | 3/2006 | Liu et al. |
| 7,022,255 B2 | 4/2006 | Siddiqui et al. |
| 7,029,508 B2 | 4/2006 | Scott et al. |
| 7,044,836 B2 | 5/2006 | Sun et al. |
| 7,056,192 B2 | 6/2006 | Venigalla et al. |
| 7,056,449 B2 | 6/2006 | Hoefler |
| 7,077,880 B2 | 7/2006 | Siddiqui |
| 7,247,567 B2 | 7/2007 | Vacassy et al. |
| 7,306,637 B2 | 12/2007 | Cherian et al. |
| 7,364,667 B2 | 4/2008 | Minamihaba et al. |
| 7,429,338 B2 | 9/2008 | Siddiqui |
| 7,585,340 B2 | 9/2009 | Dysard |
| 7,618,723 B2 | 11/2009 | Usui et al. |
| 7,691,287 B2 | 4/2010 | Siddiqui et al. |
| 7,915,071 B2 | 3/2011 | Siddiqui et al. |
| 7,994,057 B2 | 8/2011 | Dysard et al. |
| 8,021,449 B2 | 9/2011 | Seth et al. |
| 8,053,479 B2 | 11/2011 | Masuda et al. |
| 8,119,529 B2 | 2/2012 | Guo et al. |
| 8,163,049 B2 | 4/2012 | Siddiqui |
| 8,252,687 B2 | 8/2012 | Li et al. |
| 8,309,615 B2 | 11/2012 | Hoefler |
| 8,361,176 B2 | 1/2013 | Seth et al. |
| 8,366,059 B2 | 2/2013 | Fannon et al. |
| 8,366,959 B2 | 2/2013 | Babu et al. |
| 8,518,135 B1 | 8/2013 | Lorpitthaya et al. |
| 8,529,787 B2 | 9/2013 | Higuchi et al. |
| 8,715,524 B2 | 5/2014 | Kamimura et al. |
| 2001/0003672 A1 | 6/2001 | Inoue et al. |
| 2003/0092271 A1 | 5/2003 | Jindal et al. |
| 2003/0157804 A1 | 8/2003 | Puppe et al. |
| 2003/0211747 A1 | 11/2003 | Hegde et al. |
| 2004/0040217 A1* | 3/2004 | Takashina et al. | 51/307 |
| 2005/0150173 A1 | 7/2005 | Vacassy |
| 2006/0096179 A1 | 5/2006 | Lu et al. |
| 2006/0124592 A1 | 6/2006 | Miller et al. |
| 2007/0075042 A1 | 4/2007 | Siddiqui |
| 2007/0251418 A1 | 11/2007 | Magee et al. |
| 2007/0269987 A1 | 11/2007 | Nakano et al. |
| 2009/0081927 A1 | 3/2009 | Grumbine et al. |
| 2009/0202816 A1 | 8/2009 | Schlenoff |
| 2009/0215269 A1 | 8/2009 | Boggs et al. |
| 2009/0246957 A1 | 10/2009 | Kamimura |
| 2010/0071272 A1 | 3/2010 | Higuchi et al. |
| 2010/0181525 A1 | 7/2010 | Belmont |
| 2010/0330809 A1 | 12/2010 | Inaba et al. |
| 2011/0318929 A1 | 12/2011 | Mishima et al. |
| 2012/0094491 A1 | 4/2012 | Kanamaru |
| 2012/0156874 A1* | 6/2012 | Han et al. | 438/667 |
| 2012/0252214 A1 | 10/2012 | Kamimura et al. |

\* cited by examiner

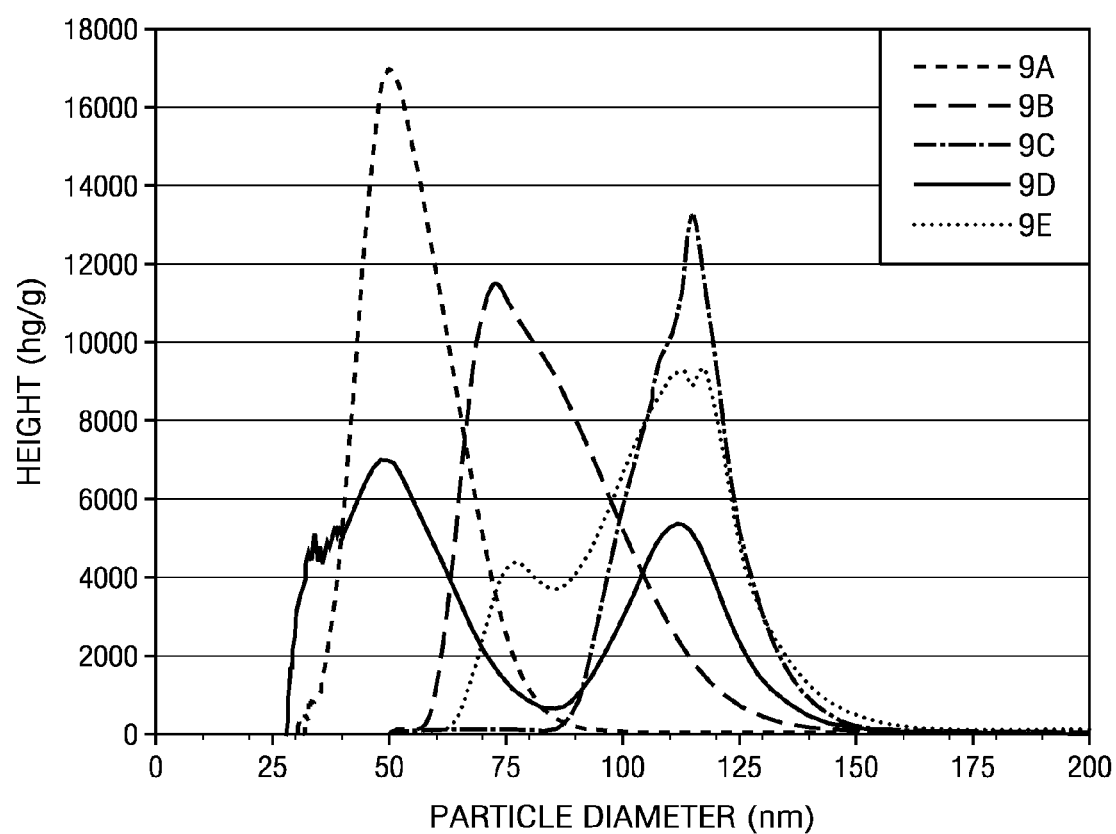

MIXED ABRASIVE TUNGSTEN CMP COMPOSITION

BACKGROUND OF THE INVENTION

Chemical mechanical polishing (CMP) compositions and methods for polishing (or planarizing) the surface of a substrate are well known in the art. Polishing compositions (also known as polishing slurries, CMP slurries, and CMP compositions) for polishing metal layers (such as tungsten) on a semiconductor substrate may include abrasive particles suspended in an aqueous solution and chemical accelerators such as oxidizers, chelating agents, catalysts, and the like.

In a conventional CMP operation, the substrate (wafer) to be polished is mounted on a carrier (polishing head) which is in turn mounted on a carrier assembly and positioned in contact with a polishing pad in a CMP apparatus (polishing tool). The carrier assembly provides a controllable pressure to the substrate, pressing the substrate against the polishing pad. The substrate and pad are moved relative to one another by an external driving force. The relative motion of the substrate and pad abrades and removes a portion of the material from the surface of the substrate, thereby polishing the substrate. The polishing of the substrate by the relative movement of the pad and the substrate may be further aided by the chemical activity of the polishing composition (e.g., by an oxidizing agent and other chemical components present in the CMP composition) and/or the mechanical activity of an abrasive suspended in the polishing composition.

In typical tungsten plug and interconnect processes, tungsten is deposited over a dielectric and within openings formed therein. The excess tungsten over the dielectric layer is then removed during a CMP operation to form tungsten plugs and interconnects within the dielectric. As semiconductor device feature sizes continue to shrink, meeting local and global planarity requirements has become more difficult in CMP operations (e.g., in tungsten CMP operations). Array erosion (also referred to as oxide erosion), plug and line recessing, and tungsten etching defects are known to compromise planarity and overall device integrity. For example, excessive array erosion may lead to difficulties in subsequent lithography steps as well as cause electrical contact problems that can degrade electrical performance.

The semiconductor industry is also subject to continuing downward pricing pressure. In order to maintain an economically favorable CMP process, high throughput is commonly required thereby necessitating a high tungsten removal rate (as well as high removal rates of any barrier/binder layers). The downward pricing pressure also extends to the CMP consumables themselves (e.g., the slurries and pads). Such pricing pressure poses a challenge to the slurry formulator as the pressure to reduce costs often conflicts with desired slurry performance metrics. There is a real need in the industry for a tungsten CMP slurry (composition) that provides improved planarity at high throughput and reduced costs.

BRIEF SUMMARY OF THE INVENTION

A chemical mechanical polishing composition for polishing a substrate having a tungsten layer is disclosed. The polishing composition includes a water based liquid carrier, first and second colloidal silica abrasives dispersed in the liquid carrier, and an iron containing accelerator. The first colloidal silica abrasive and the second colloidal silica abrasive each have a permanent positive charge of at least 10 mV. Moreover, an average particle size of the second silica abrasive is at least 20 nanometers greater than an average particle size of the first silica abrasive. A method for chemical mechanical polishing a substrate including a tungsten layer is further disclosed. The method may include contacting the substrate with the above described polishing composition, moving the polishing composition relative to the substrate, and abrading the substrate to remove a portion of the tungsten from the substrate and thereby polish the substrate.

BRIEF DESCRIPTION OF THE FIGURE

For a more complete understanding of the disclosed subject matter, and advantages thereof, reference is now made to the following descriptions taken in conjunction with the accompanying FIGURE which depicts particle size distributions in a plot of height (hg/g) versus particle diameter (nm) for polishing compositions 9A, 9B, 9C, 9D, and 9E of Example 9.

DETAILED DESCRIPTION OF THE INVENTION

In one embodiment, a chemical mechanical polishing composition for polishing a substrate having a tungsten layer includes a water based liquid carrier and first and second colloidal silica abrasives dispersed in the liquid carrier, and an iron containing accelerator. Each of the colloidal silica abrasives has a permanent positive charge of at least 10 mV. The average particle size of the second colloidal silica is at least 20 nanometers greater than the average particle size of the first colloidal silica. The polishing composition may further optionally include a stabilizer bound to the iron containing accelerator, a hydrogen peroxide oxidizer, and/or a pH in a range from about 1.5 to about 5.0. The first and second colloidal silica abrasives may also be treated with an aminosilane compound.

The first silica abrasive includes colloidal silica particles. As used herein the term colloidal silica particles refers to silica particles that are prepared via a wet process rather than a pyrogenic or flame hydrolysis process which produces structurally different particles. The colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes.

Preferably, the colloidal silica is precipitated or condensation-polymerized silica, which may be prepared using any method known to those of ordinary skill in the art, such as by the sol gel method or by silicate ion-exchange. Condensation-polymerized silica particles are often prepared by condensing $Si(OH)_4$ to form substantially spherical particles. The precursor $Si(OH)_4$ may be obtained, for example, by hydrolysis of high purity alkoxysilanes, or by acidification of aqueous silicate solutions. Such abrasive particles may be prepared, for example, in accordance with U.S. Pat. No. 5,230,833 or may be obtained as any of various commercially available products such as the BINDZIL 50/80, 30/310, and 40/130 products from EKA Chemicals, the Fuso PL-1, PL-2, PL-3, and PL-3H products, and the Nalco 1034A, 1050, 2327, and 2329 products, as well as other similar products available from DuPont, Bayer, Applied Research, Nissan Chemical (the SNOWTEX products), and Clariant.

The second silica abrasive may include substantially any suitable silica abrasive particles, for example, including the aforementioned colloidal silica and pyrogenic (fumed) silica. Pyrogenic silica is produced via a flame hydrolysis process in which suitable feedstock vapor (such as silicon tetra-chloride) is combusted in a flame of hydrogen and oxygen. Molten particles of roughly spherical shapes are formed in the combustion process, the diameters of which may be varied via process parameters. These molten spheres, commonly referred to as primary particles, fuse with one another by undergoing collisions at their contact points to form branched, three dimensional chain-like aggregates. Fumed silica abrasives are commercially available from a number of suppliers including, for example, Cabot Corporation, Evonic, and Wacker Chemie.

The particle size of a particle suspended in a dispersion may be defined in the industry using various means. In the embodiments disclosed herein, the particle size is defined as measured by the CPS Disc Centrifuge, Model DC24000HR (available from CPS Instruments, Prairieville, La.). The abrasive particles may have any suitable particle size. The abrasive particles may have an average particle size of about 10 nm or more (e.g., about 20 nm or more, about 40 nm or more, about 50 nm or more, about 80 nm or more, or about 100 nm or more). The abrasive particles may have an average particle size of about 200 nm or less (e.g., about 180 nm or less, about 150 nm or less, about 130 nm or less, about 110 nm or less, or about 80 nm or less). Accordingly, the abrasive particles may have an average particle size in a range from about 10 nm to about 200 nm (e.g., from about 20 nm to about 180 nm, or from about 50 to about 130).

The first silica abrasive has an average particle size that differs from an average particle size of the second silica abrasive. For example, the average particle size of the first silica abrasive may less than that of the second silica abrasive. Alternatively, the average particle size of the first silica abrasive may be greater than that of the second silica abrasive. The first silica abrasive may have an average particle size that differs from the average particle size of the second silica abrasive by at least 20 nm (e.g., at least 30 nm). The average particle size of the second silica abrasive is preferably at least 20 nm (e.g., at least 30 nm) greater than that of the first silica abrasive.

The average particle size of the first silica abrasive may be about 10 nm or more (e.g., about 30 nm or more, about 40 nm or more, or about 50 nm or more). The average particle size of the first silica abrasive may be about 130 nm or less (e.g., about 110 nm or less, about 100 nm or less, or about 90 nm or less). Accordingly, the average particle size of the first silica abrasive may be in a range from about 10 nm to about 130 nm (e.g., from about 20 nm to about 110 nm, from about 40 to about 100 nm, or from about 50 to about 90 nm). The average particle size of the second silica abrasive may be about 80 nm or more (e.g., about 90 nm or more, about 100 nm or more, or about 110 nm or more). The average particle size of the second silica abrasive may be about 200 nm or less (e.g., about 180 nm or less, about 170 nm or less, or about 160 nm or less). Accordingly, the average particle size of the second silica abrasive may be in a range from about 80 nm to about 200 nm (e.g., from about 90 nm to about 180 nm, or from about 100 to about 160 nm).

The first and second silica abrasives may include a partially aggregated colloidal silica. By partially aggregated it is meant that 50 percent or more of the colloidal silica abrasive particles include two or more aggregated primary particles (e.g., two, three, four, or more aggregated primary particles). Thus in an embodiment in which each of the first and second silica abrasives include partially aggregated colloidal silica, 50 percent or more of the colloidal silica abrasive particles in the first silica abrasive include two or more aggregated primary particles and 50 percent or more of the colloidal silica abrasive particles in the second silica abrasive include two or more aggregated primary particles. For example, a polishing composition may include a first silica abrasive in which 50 percent or more of the abrasive particles include two aggregated primary particles and a second silica abrasive in which 50 percent or more of the abrasive particles include two aggregated primary particles.

A partially aggregated dispersion in which 50 percent or more of the colloidal silica abrasive particles include two or more aggregated primary particles may be prepared, for example, using a multi-step process in which primary particles are first grown in solution, for example as described in the '833 patent. The pH of the solution may then be adjusted to an acidic value for a predetermined time period to promote aggregation (or partial aggregation). An optional final step may allow for further growth of the aggregates (and any remaining primary particles).

In embodiments in which the first and second silica abrasives both have a permanent positive charge, disclosed polishing compositions may include a mixed abrasive or a single abrasive having a bimodal distribution. By mixed abrasive it is meant that distinct first and second dispersions are mixed together after the abrasive particles have been fully grown. A single abrasive having a bimodal distribution is a dispersion in which the colloidal silica particles have been processed so as to grow abrasive particles having a bimodal distribution.

The polishing composition may include any suitable amount of silica abrasive particles. The polishing composition may include about 0.01 weight percent or more of each of the first silica abrasive and the second silica abrasive (e.g., about 0.02 weight percent or more, about 0.05 weight percent or more, or about 0.1 weight percent or more). The polishing composition may include about 1 weight percent or less of each of the first silica abrasive and the second silica abrasive (e.g., about 0.8 weight percent or less, about 0.6 weight percent or less, or about 0.4 weight percent or less). Accordingly, the amount of each of the first silica abrasive and the second silica abrasive may be in a range from about 0.01 weight percent to about 1 weight percent (e.g., from about 0.02 weight percent to about 0.8 weight percent, from about 0.05 weight percent to about 0.6 weight percent, or from about 0.1 weight percent to about 0.04 weight percent). The total amount of silica abrasive (the sum of the amount of the first silica abrasive and the amount of the second silica abrasive) may be less than about 2.0 weight percent (e.g., less than about 1.5 weight percent, or less than about 1.0 weight percent, or even less than about 0.5 weight percent).

The liquid carrier is used to facilitate the application of the abrasive and any optional chemical additives to the surface of a suitable substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The first silica abrasive includes colloidal silica particles having a positive charge of at least 10 mV in the polishing composition. The charge on dispersed particles such as colloidal silica particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of a dispersion such as a polishing composition may be obtained using commercially available instrumentation such as the DT-1202, an electroacoustic spectrometer available from Dispersion Technologies, Inc.

The colloidal silica particles of the first silica abrasive in the polishing composition have a permanent positive charge of about 10 mV or more (e.g., about 15 mV or more or about 20 mV or more). The colloidal silica particles of the first silica abrasive in the polishing composition may have a permanent positive charge of about 50 mV or less (e.g., about 45 mV or less, about 40 mV or less, or about 35 mV or less). Preferably, colloidal silica particles of the first silica abrasive have a permanent positive charge in a range from about 10 mV to about 50 mV (e.g., from about 15 mV to about 40 mV).

By permanent positive charge it is meant that the positive charge on the silica particles is not readily reversible, for example, via flushing, dilution, filtration, and the like. A permanent positive charge may be the result, for example, of covalently bonding a cationic species with the colloidal silica. A permanent positive charge is in contrast to a reversible positive charge (a non-permanent positive charge) that may be the result, for example, of an electrostatic interaction between a cationic species and the colloidal silica.

Notwithstanding, as used herein, a permanent positive charge of at least 10 mV means that the zeta potential of the silica particles remains above 10 mV after the following three step ultrafiltration test. A portion of a polishing composition (e.g., initially a 200 ml sample) is passed through a Millipore Ultracell regenerated cellulose ultrafiltration disk (e.g., having a MW cutoff of 100,000 Daltons and a pore size of 6.3 nm). The remaining dispersion (the approximately 65 ml of dispersion that is retained by the ultrafiltration disk) is collected and replenished to the original volume with pH adjusted deionized water. The deionized water is pH adjusted to the original pH of the polishing composition using a suitable inorganic acid or base such as nitric acid or potassium hydroxide. This procedure is repeated for a total of three ultrafiltration cycles (each of which includes an ultrafiltration step and a replenishing step). The zeta-potential of the triply ultra-filtered and replenished polishing composition is then measured and compared with the zeta potential of the original polishing composition. This three step ultrafiltration test is further illustrated below by way of example (in Example 8).

While not wishing to be bound by theory, it is believed that the dispersion retained by the ultrafiltration disk (the retained dispersion) includes the silica particles and any chemical components (e.g., cationic species) that may be associated with the surface of the particles (e.g., bonded to, attached to, electrostatically interacting with, or in contact with the particle surface). At least a portion of the liquid carrier and the chemical components dissolved therein pass through the ultrafiltration disk. Replenishing the retained dispersion to the original volume is believed to upset the equilibrium in the original polishing composition such that the chemical components associated with the particle surface may tend towards a new equilibrium. Components that are strongly associated (e.g., covalently bonded) with the particle surface remain on the surface such that there tends to be little if any change in the positive zeta potential of the particle. In contrast, a portion of components that have a weaker association (e.g., an electrostatic interaction) with the particle surface may return to the solution as the system tends towards the new equilibrium thereby resulting in a reduction in the positive zeta potential. Repeating this process for a total of three ultrafiltration and replenishing cycles is believed to amplify the above described effect.

It is preferred that after correcting for ionic strength differences there is little (or no) difference between the zeta potential of the silica particles in the original polishing composition and the silica particles in the triply ultra-filtered and replenished polishing composition obtained from the above described three step ultrafiltration test. It will be understood that prior to correcting for ionic strength differences, the measured zeta potential may be observed to increase due to the reduced ionic strength of the triply ultra-filtered and replenished polishing composition. After correcting for ionic strength differences, it is preferred that any reduction in the positive charge (reduction in the positive zeta potential) on the particles resulting from the aforementioned three step ultrafiltration test is less than 10 mV (e.g., less than about 7 mV, less than about 5 mV, or even less than about 2 mV).

Silica abrasive particles containing an aminosilane compound may have a permanent positive charge. Thus a permanent positive charge may be achieved, for example, via treating the particles with at least one aminosilane compound. Such compounds include primary aminosilanes, secondary aminosilanes, tertiary aminosilanes, quaternary aminosilanes, and multi-podal (e.g., dipodal) aminosilanes. The aminosilane compound may include substantially any suitable aminosilane, for example, a propyl group containing aminosilane or an aminosilane compound including a propyl amine. Examples of suitable aminosilanes may include bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium chloride, N-(trialkoxysilylethyl)benzyl-N,N,N-trimethyl ammonium chloride, (bis(methyldialkoxysilylpropyl)-N-methyl amine, bis(trialkoxysilylpropyl)urea, bis(3-(trialkoxysilyl)propyl)-ethylenediamine, bis(trialkoxysilylpropyl)amine, bis(trialkoxysilylpropyl)amine, and mixtures thereof.

Any suitable method of treating the silica particles, many of which are known to those of ordinary skill in the art, may be used. For example, the silica particles may be treated with the aminosilane compound before mixing with the other components of the polishing composition or the aminosilane and the colloidal silica particles may be added simultaneously to the other components of the polishing composition.

The aminosilane compound may be present in the polishing composition in any suitable amount. The amount of aminosilane utilized may depend on several factors, for example, including the particle size, the surface area of the particle, the particular aminosilane compound used, and the desired charge on the particle. In general the amount of aminosilane used increases with decreasing particle size (and therefore increasing surface area) and increasing charge on the particle. For example, to achieve a permanent positive charge of 25 mV or more, 20 ppm or more of aminosilane may be used for a dispersion having a particle size of 110 nm, 70 ppm or more of aminosilane may be used for a dispersion having a particle size of 75 nm, and 130 ppm or more of aminosilane may be used for a dispersion having a particle size of 55 nm. Thus the polishing composition may include about 5 ppm or more (e.g., about 10 ppm or more, about 15 ppm or more, or about 20 ppm or more) of the aminosilane compound. The polishing composition preferably includes an amount of aminosilane sufficient to provide the desired permanent positive charge without using an excess. Thus the polishing composition may include about 500 ppm or less (e.g., about 300 ppm or less, or about 200 ppm or less, or about 150 ppm or less) of the aminosilane compound. Preferably, the polishing composition includes a range from about 5 ppm to about 500 ppm (e.g., from about 10 ppm to about 300 ppm, from about 15 ppm to about 200 ppm, or from about 20 ppm to about 150 ppm) of the aminosilane compound.

Polymer amines may be used to impart a permanent positive charge (or a semi-permanent positive charge that requires more than three ultra-filtration cycles to reverse) to certain silica abrasive particles. While such polymer amines may provide a permanent (or semi-permanent) positive charge to the silica particles, the presence of certain polymer amines may have a negative effect on tungsten removal rates in some CMP compositions and CMP operations. Therefore, it may be preferable in certain embodiments that the polishing composition be substantially free of polymer amines (and that the permanent positive charge be imparted via other means).

In certain disclosed embodiments, the second silica abrasive may have a neutral charge or a non-permanent positive charge. By neutral charge it is meant that the zeta potential of the silica abrasive particles is near zero, for example, in a range from about −5 to about 5 mV. Silica abrasive particles having a neutral charge are generally untreated. A silica abrasive having a non-permanent positive charge is one in which the abrasive particles have a reversible (or partially reversible) positive charge of greater than about 5 mV (e.g. via flushing, dilution, filtration, and the like). The above described ultra-filtration test may be used to discriminate between silica abrasive particles having permanent and non-permanent positive charges. For example, silica abrasive particles having a non-permanent positive charge are particles in which the positive charge is reduced below some threshold (e.g., 10 mV) after ultra-filtration and replenishing. Likewise, silica abrasive particles having a non-permanent positive charge are particles in which the positive charge may decrease after correcting for ionic strength differences (e.g., by more than 5 mV, or by more than 10 mV). This distinction between a permanent and non-permanent positive charge is further illustrated in Example 8.

Silica abrasive particles in contact with a cation containing component (i.e., a positively charged species) may have a non-permanent positive charge. Thus a non-permanent positive charge may be achieved, for example, via treating the particles with at least one cation containing component. The treatment component may be selected, for example, from ammonium salts (preferably quaternary amine compounds), phosphonium salts, sulfonium salts, imidazolium salts, and pyridinium salts. Ammonium salts may include $R^1R^2R^3R^4N^+X^-$; phosphonium salts may include $R^1R^2R^3R^4P^+X^-$; and sulfonium salts may include $R^1R^2R^3S^+X^-$, where $R^1$, $R^2$, $R^3$, and $R^4$ represent independently a $C_1$-$C_6$ alkyl, a $C_7$-$C_{12}$ arylalkyl, or a $C_6$-$C_{10}$ aryl. These groups can, of course, be further substituted with one or more hydroxyl groups. The anion $X^-$ can be any suitable anion that preferably does not react with other components of the polishing composition. Non-limiting examples of suitable anions include hydroxide, chloride, bromide, fluoride, nitrate, sulfate, hydrogen sulfate, methanesulfonate, methylsulfate (i.e., $CH_3OSO_3^-$), and the like. The cationic component in an ammonium salt may include, for example, tetramethylammonium, tetraethylammonium, tetrapropylammonium, tetrabutylammonium, tetrapentylammonium, ethyltrimethylammonium, and diethyldimethylammonium. The cationic component in a phosphonium salt may include, for example, tetramethylphosphonium, tetraethylphosphonium, tetrapropylphosphonium, tetrabutylphosphonium, tetraphenylphosphonium, methyltriphenylphosphonium, ethyltriphenylphosphonium, butyltriphenylphosphonium, benzyltriphenylphosphonium, dimethyldiphenylphosphonium, hydroxymethyltriphenylphosphonium, and hydroxyethyltriphenylphosphonium. The cationic component in a sulfonium salt may include, for example, trimethylsulfonium and triethylsulfonium. The cationic component in an imidazolium salt may include, for example, 1-ethyl-3-methylimidazolium, 1-butyl-3-methylimidazolium, 1-benzyl-3-methylimidazolium, 1-hexyl-3-methylimidazolium, and 1-ethyl-2,3-dimethylimidazolium. The cationic component in a pyridinium salt may include, for example, 1-methylpyridinium.

The polishing composition is generally acidic having a pH of less than about 7. The polishing composition typically has a pH of about 1 or more (e.g., about 1.5 or more, or about 2 or more). Preferably, the polishing composition has a pH of about 6 or less (e.g., about 5 or less, or about 4 or less). More preferably, the polishing composition has a pH in a range from about 1 to about 6 (e.g., from about 1.5 to about 5, or from about 2 to about 4, or from about 2 to about 3.5). The pH of the polishing composition may be achieved and/or maintained by any suitable means. The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, and the like while suitable buffering agents may include phosphates, sulfates, acetates, malonates, oxalates, borates, ammonium salts, and the like.

Optional embodiments of the polishing composition may further include an iron containing accelerator. An iron containing accelerator as used herein is an iron containing chemical component that increases the removal rate of tungsten during a tungsten CMP operation. For example, the iron containing accelerator may include an iron containing catalyst such as is disclosed in U.S. Pat. Nos. 5,958,288 and 5,980,775. Such an iron containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, acetylacetonates, citrates, gluconates, malonates, oxalates, phthalates, and succinates, and mixtures thereof.

An iron containing accelerator may also include an iron containing activator (e.g., a free radical producing compound) or an iron containing catalyst associated with (e.g., coated or bonded to) the surface of the colloidal silica particle such as is disclosed in U.S. Pat. Nos. 7,029,508 and 7,077,880. For example, the iron containing accelerator may be bonded with the silanol groups on the surface of the colloidal surface particle. In one embodiment the iron containing accelerator may include a boron containing stabilizer and an iron containing catalyst. In such embodiments the stabilizer and catalyst may occupy substantially any percentage of the available surface sites on the colloidal silica particles, for example, greater than 1%, greater than 50%, or greater than 80% of the available surface sites.

The amount of iron containing accelerator in the polishing composition may be varied depending upon the oxidizing agent used and the chemical form of the accelerator. When the preferred oxidizing agent hydrogen peroxide (or its analogs) is used and a soluble iron containing catalyst is used (such as ferric nitrate), the catalyst may be present in the composition in an amount sufficient to provide a range from about 1 to about 3000 ppm Fe based on the total weight of the composition. The polishing composition preferably includes about 1 ppm Fe or more (e.g., about 5 ppm or more, about 10 ppm or more, or about 20 ppm or more). The polishing composition preferably includes about 500 ppm Fe or less (e.g., about 200 ppm or less, about 100 ppm or less, or about 50 ppm or less). The polishing composition may thus include a range from about 1 to about 500 ppm Fe (e.g., from about 3 to about 200 ppm, from about 5 to about 100 ppm, or from about 10 to about 50 ppm).

Embodiments of the polishing composition including an iron containing accelerator may further include a stabilizer. Without such a stabilizer, the iron containing accelerator and the oxidizing agent may react in a manner that degrades the oxidizing agent rapidly over time. The addition of a stabilizer tends to reduce the effectiveness of the iron containing accelerator such that the choice of the type and amount of stabilizer added to the polishing composition may have a significant impact on CMP performance. The addition of a stabilizer may lead to the formation of a stabilizer/accelerator complex that inhibits the accelerator from reacting with the oxidizing agent while at the same time allowing the accelerator to remain sufficiently active so as to promote rapid tungsten polishing rates.

Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. For purposes of this application the term "acid" as it is used to describe useful stabilizers also means the conjugate base (or bases) of the acid stabilizer. For example the term "adipic acid" means adipic acid and its conjugate bases. Stabilizers can be used alone or in combination and significantly decrease the rate at which oxidizing agents such as hydrogen peroxide decomposes.

Preferred stabilizers include acetic acid, phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. The preferred stabilizers may be added to the compositions and slurries of this invention in an amount ranging from about 1 equivalent per iron containing accelerator to about 3.0 weight percent or more. As used herein, the term "equivalent per iron containing accelerator" means one molecule of stabilizer per iron species in the composition. For example, 2 equivalents per iron containing accelerator means two molecules of stabilizer for each iron species.

The polishing composition may further include an oxidizing agent. The oxidizing agent may be added to the polishing composition during the slurry manufacturing process or just prior to the CMP operation (e.g., in a tank located at the semiconductor fabrication facility). Preferable oxidizing agents include inorganic or organic per-compounds. A per-compound as defined by Hawley's Condensed Chemical Dictionary is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^-$), dipersulfates ($S_2O_8^-$), and sodium peroxide. Examples of compounds containing an element in its highest oxidation state include but are not limited to periodic acid, periodate salts, perbromic acid, perbromate salts, perchloric acid, perchlorate salts, petrboric acid, and perborate salts and permanganates. The most preferred oxidizing agents is hydrogen peroxide.

The oxidizing agent may be present in the polishing composition in an amount ranging, for example, from about 0.1 to about 10 weight percent. In preferred embodiments in which a hydrogen peroxide oxidizer and a soluble iron containing accelerator are used, the oxidizer may be present in the polishing composition in an amount ranging from about 0.1 to about 6 weight percent (e.g., from about 0.2 to about 5 weight percent, from about 0.5 to about 4 weight percent, or from about 1 to about 3 weight percent).

The polishing composition may optionally further include a compound that inhibits tungsten etching. Suitable inhibitor compounds inhibit the conversion of solid tungsten into soluble tungsten compounds while at the same time allowing for effective removal of solid tungsten via the CMP operation. Classes of compounds that that are useful inhibitors of tungsten etching include compounds having nitrogen containing functional groups such as nitrogen containing heterocycles, alkyl ammonium ions, amino alkyls, and amino acids. Useful amino alkyl corrosion inhibitors include, for example, hexylamine, tetramethyl-p-phenylene diamine, octylamine, diethylene triamine, dibutyl benzylamine, aminopropylsilanol, aminopropylsiloxane, dodecylamine, mixtures thereof, and synthetic and naturally occurring amino acids including, for example, lysine, tyrosine, glutamine, glutamic acid, cysteine, and glycine (aminoacetic acid).

The inhibitor compound may alternatively and/or additionally include an amine compound in solution in the liquid carrier. The amine compound (or compounds) may include a primary amine, a secondary amine, a tertiary amine, or a quaternary amine. The amine compound may further include a monoamine, a diamine, a triamine, a tetramine, or an amine based polymer having a large number of repeating amine groups (e.g., 4 or more amine groups).

In certain embodiments of the polishing compound the amine compound may include a long chain alkyl group. By long chain alkyl group it is meant that the amine compound includes an alkyl group having at least 10 carbon atoms (e.g., at least 12 carbon atoms or at least 14 carbon atoms). Such amine compounds may include, for example, dodecylamine, tetradecylamine, hexadecylamine, octadecylamine, oleylamine, N-methyldioctylamine, N-methyloctadecylamine, cocamidopropylamine oxide, benzyldimethylhexadecylammonium chloride, benzalkonium chloride, cocoalkylmethyl [polyoxyethylene (15)]ammonium chloride, octadecylmethyl[polyoxyethylene (15)]ammonium chloride, cetyltrimethylammonium bromide, and the like.

In certain embodiments of the polishing composition the amine compound may include a polycationic amine. A polycationic amine (as the term is used herein) is an amine compound having multiple (two or more) amine groups in which each of the amine groups is cationic (i.e., has a positive charge). Thus the polycationic amine may include a polyquatemary amine. By polyquaternary amine it is meant that the amine compound includes from 2 to 4 quaternary ammonium groups such that the polyquatemary amine is a diquatemary amine, a triquaternary amine, or a tetraquaternary amine compound. Diquaternary amine compounds may include, for example, N,N'-methylenebis(dimethyltetradeclammonium bromide), 1,1,4,4-tetrabutylpiperazinediium dibromide, N,N,N',N',N'-pentamethyl-N-tallow-1,3-propane-diammonium dichloride, N,N'-hexamethylenebis(tributylammonium hydroxide), decamethonium bromide, didodecyl-tetramethyl-1,4-butanediaminium diiodide, 1,5-dimethyl-1,5-diazoniabicyclo(3.2.2)nonane dibromide, and the like. Triquaternary amine compounds may include, for example, N(1),N(6)-didoecyl-N(1),N(1),N(6),N(6)-tetramethyl-1,6-hexanediaminium diiodide. Tetraquatemary amine compounds may include, for example, methanetetrayltetrakis (tetramethylammonium bromide). The polyquaternary amine compound may further include a long chain alkyl group (e.g., having 10 or more carbon atoms). For example, a polyquaternary amine compound having a long chain alkyl group may include N,N'-methylenebis (dimethyltetradeclammonium bromide), N,N,N',N',N'-pentamethyl-N-tallow-1,3-propanediammonium dichloride, didodecyl-tetramethyl-1,4-butanediaminium diiodide, and N(1),N(6)-didodecyl-N(1),N(1),N(6),N(6)-tetramethyl-1,6-hexanediaminium diiodide.

A polycationic amine may also be polycationic in that each of the amine groups is protonated (and therefore has a positive charge). For example, a dicationic amine such as tetramethyl-p-phenylenediamine includes two tertiary amine groups that may be protonated (and therefore positively charged) at polishing composition pH values less than the pKa of the amine compound.

In certain embodiments of the polishing composition the amine compound may include an amine based polymer. Such a polymer includes four or more amine groups. The amine based polymer may include, for example, triethylenetetramine, tetraethylenepentamine, pentaethylenehexamine, and polymers including the following amine containing functional groups methacryloylox-ethyl trimethyl ammonium methylsulfate, diallyl dimethyl ammonium chloride, and methacrylamido-propyl trimethyl ammonium chloride.

The polishing composition may include substantially any suitable concentration of the inhibitor compound. In general the concentration is desirably high enough to provide adequate etch inhibition, but low enough so that the compound is soluble and so as not to reduce tungsten polishing rates below acceptable levels. By soluble it is meant that the compound is fully dissolved in the liquid carrier or that it forms micelles in the liquid carrier or is carried in micelles. It may be necessary to vary the concentration of the inhibitor compound depending upon numerous various factors, for example, including the solubility thereof, the number of amine groups therein, the length of an alkyl group, the relationship between etch rate inhibition and polishing rate inhibition, the oxidizing agent used, the concentration of the oxidizing agent, and so on. In certain desirable embodiments, the concentration of an amine compound in the polishing composition may be in a range from about 0.1 µM to about 10 mM (i.e., from about $10^{-7}$ to about $10^{-2}$ molar). For example, in embodiments utilizing an amine based polymer having a high molecular weight, the concentration may be on the lower end of the range (e.g., from about $10^{-7}$ to about $10^{-4}$ molar). In other embodiments utilizing a comparatively simple amine compound (having fewer amine groups and a lower molecular weight), the concentration may be on the higher end of the range (e.g., from about $10^{-5}$ to about $10^{-2}$ molar).

The polishing composition may optionally further include a biocide. The biocide may include any suitable biocide, for example an isothiazolinone biocide. The amount of biocide in the polishing composition typically is in a range from about 1 ppm to about 50 ppm, and preferably from about 1 ppm to about 20 ppm.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the colloidal silica, the iron containing accelerator, the amine compound, etc.).

For example, a first silica abrasive may be dispersed in an aqueous liquid carrier to obtain a first dispersion. The first dispersion may then be treated, for example, with an aminosilane compound so as to produce a colloidal silica abrasive having a permanent positive charge of at least 10 mV. A second silica abrasive may be dispersed in an aqueous liquid carrier to obtain a second dispersion. The second dispersion may then be treated, for example, with a quaternary amine compound so as to produce a silica abrasive having a non-permanent positive charge. The first and second treated dispersions may then be mixed together prior to adding the other components (such as an iron containing accelerator and a stabilizer). Alternatively, the other components may be added to one of the treated dispersions prior to mixing the first and second dispersions together. The first and second dispersions and the other components may be blended together using any suitable techniques for achieving adequate mixing. The oxidizing agent may be added at any time during the preparation of the polishing composition. For example, the polishing composition may be prepared prior to use, with one or more components, such as the oxidizing agent, being added just prior to the CMP operation (e.g., within about 1 minute, or within about 10 minutes, or within about 1 hour, or within about 1 day, or within about 1 week of the CMP operation). The polishing composition also may also be prepared by mixing the components at the surface of the substrate (e.g., on the polishing pad) during the CMP operation.

The polishing composition may be supplied as a one-package system comprising a first silica abrasive having a permanent positive charge of at least 10 mV, a second silica abrasive having a neutral or non-permanent positive charge, and other optional components such as an iron containing accelerator, a stabilizer, a tungsten etching inhibitor, a biocide, and the like. The oxidizing agent desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). Various other two-container, or three- or more-container, combinations of the components of the polishing composition are within the knowledge of one of ordinary skill in the art.

The polishing composition of the invention may also be provided as a concentrate which is intended to be diluted with an appropriate amount of water prior to use. In such an embodiment, the polishing composition concentrate may include the first silica abrasive having a permanent positive charge of at least 10 mV, the second silica abrasive having a neutral or non-permanent positive charge, water, and other optional components such as an iron containing accelerator, a stabilizer, a tungsten etching inhibitor, and a biocide, with or without the oxidizing agent, in amounts such that, upon dilution of the concentrate with an appropriate amount of water, and the oxidizing agent if not already present in an appropriate amount, each component of the polishing composition will be present in the polishing composition in an amount within the appropriate range recited above for each component. For example, the first silica abrasive having a permanent positive charge of at least 10 mV, the second silica abrasive having a neutral or non-permanent positive charge, and other optional components such as an iron containing accelerator, a stabilizer, a tungsten etching inhibitor, and a biocide, may each be present in the polishing composition in an amount that is about 2 times (e.g., about 3 times, about 4 times, about 5 times, or even about 10 times) greater than the concentration recited above for each component so that, when the concentrate is diluted with an equal volume of (e.g., 2 equal volumes of water, 3 equal volumes of water, 4 equal volumes of water, or even 9 equal volumes of water respectively), along with the oxidizing agent in a suitable amount, each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

Although the polishing composition of the invention may be used to polish any substrate, the polishing composition is particularly useful in the polishing of a substrate comprising at least one metal including tungsten and at least one dielectric material. The tungsten layer may be deposited over one or more barrier layers, for example, including titanium and/or titanium nitride (TiN). The dielectric layer may be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as tungsten, titanium, titanium nitride, and/or a dielectric material as described herein) to polish the substrate.

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The following examples further illustrate the invention but, of course, should not be construed as in any way limiting its scope.

Example 1

In the Examples disclosed herein, mixed silica abrasive polishing compositions were prepared using first and second silica abrasives selected from nine silica abrasive dispersions. Dispersions A1, B1, C1 and D1 included colloidal silica dispersions treated with an aminosilane (aminopropyl trialkoxysilane) such that the colloidal silica particles had a permanent positive charge of greater than 10 mV. Dispersions A2, B2, C2, and D2 included colloidal silica particles dispersed in an aqueous solution. The colloidal silica abrasives in A1, A2, B1, B2, C1, C2, D1, and D2 each contained a partially aggregated silica abrasive in which 50 percent or more of the colloidal silica abrasive particles include two aggregated primary particles. Dispersion F2 included an untreated fumed silica having a surface area of about 150 $m^2/g$ which was dispersed in an aqueous solution. Further details regarding these nine silica abrasive dispersions are presented in Table 1. The primary particle sizes were estimated using conventional spherical extrapolation of BET surface area measurements. The aggregate particle sizes were obtained using a CPS Disc Centrifuge, Model DC24000HR (available from CPS Instruments, Prairieville, La.).

TABLE 1

| Abrasive | Primary Size (nm) | Aggregate Size (nm) | Aminosilane Treated |
|---|---|---|---|
| A1 | 15 | 30 | Yes |
| B1 | 35 | 55 | Yes |
| C1 | 56 | 90 | Yes |
| D1 | 75 | 115 | Yes |
| A2 | 15 | 30 | No |
| B2 | 35 | 55 | No |
| C2 | 56 | 90 | No |
| D2 | 75 | 115 | No |
| F2 |  | 160 | No |

Example 2

The tungsten (W) polishing rate was evaluated in this example for various polishing compositions, each of which included first and second silica abrasives selected from dispersions A1, B1, C1, and D1 in Example 1. The first and second silica abrasives in this example each included a colloidal silica having a permanent positive charge of greater than 10 mV. This example demonstrates the effects of the relative amounts of the first and second silica abrasives and the particle sizes of the first and second silica abrasives on the W polishing rate. Each of the polishing compositions had a pH of about 2.5 and included 0.031 weight percent ferric nitrate nonahydrate ($Fe(NO_3)_3 \cdot 9H_2O$), 0.04 weight percent malonic acid, and 2.4 weight percent hydrogen peroxide. The W polishing rates were obtained by polishing eight inch blanket wafers having a W layer using a Mirra® CMP tool (available from Applied Materials) and an IC 1010 polishing pad at down-force of 2.5 psi, a platen speed of 103 rpm, a head speed of 97 rpm, and a slurry flow rate of 150 ml/min. The polishing time was two minutes. The weight percents of the first and second silica abrasives and the corresponding W removal rates are shown on Table 2.

TABLE 2

| Polishing Composition | First Abrasive (wt. %) | Second Abrasive (wt. %) | W Polishing Rate (Å/min) |
|---|---|---|---|
| 2A | 0.75% A1 | 0.25% B1 | 2700 |
| 2B | 0.5% A1 | 0.5% B1 | 3450 |
| 2C | 0.25% A1 | 0.75% B1 | 3680 |
| 2D | 0.75% A1 | 0.25% C1 | 4020 |
| 2E | 0.5% A1 | 0.5% C1 | 4110 |
| 2F | 0.25% A1 | 0.75% C1 | 4100 |
| 2G | 0.75% A1 | 0.25% D1 | 3500 |
| 2H | 0.5% A1 | 0.5% D1 | 3990 |
| 2I | 0.25% A1 | 0.75% D1 | 4020 |
| 2J | 0.75% B1 | 0.25% C1 | 4010 |
| 2K | 0.5% B1 | 0.5% C1 | 3820 |

As is apparent from the results set forth in Table 2, high tungsten removal rates can be achieved using a wide range of mixtures of silica abrasive particles having a permanent positive charge greater than 10 mV. In particular, high W polishing rates may be achieved when there is at least a 20 nm difference in particle size between the first and second silica abrasives.

Example 3

The tungsten (W) polishing rate was evaluated in this example for various polishing compositions, each of which included first and second silica abrasives selected from dispersions A1, B1, C1, and D1 in Example 1. The first and second silica abrasives in this example each included a colloidal silica having a permanent positive charge of greater than 10 mV. This example also demonstrates the effects of the relative amounts of the first and second silica abrasives and the particle sizes of the first and second silica abrasives on the W polishing rate. Each of the polishing compositions had a pH of about 2.5 and included 0.031 weight percent ferric nitrate nonahydrate, 0.04 weight percent malonic acid, and 2.4 weight percent hydrogen peroxide. The W polishing rates were obtained by polishing eight inch blanket wafers having a W layer using a Mirra® CMP tool (available from Applied Materials) and an IC 1010 polishing pad at down-force of 2.5 psi, a platen speed of 103 rpm, a head speed of 97 rpm, and a slurry flow rate of 150 ml/min. The polishing time in this example was one minute. The weight percents of the first and second silica abrasives and the corresponding W removal rates are shown on Table 3. Note that polishing composition 3A and 3B correspond with polishing compositions 2E and 2H in Example 2 with the only difference being in polishing time.

TABLE 3

| Polishing Composition | First Abrasive (wt. %) | Second Abrasive (wt. %) | W Polishing Rate (Å/min) |
| --- | --- | --- | --- |
| 3A | 0.5% A1 | 0.5% C1 | 3040 |
| 3B | 0.5% A1 | 0.5% D1 | 2860 |
| 3C | 0.25% B1 | 0.75% C1 | 2500 |
| 3D | 0.75% B1 | 0.25% D1 | 2940 |
| 3E | 0.5% B1 | 0.5% D1 | 2700 |
| 3F | 0.25% B1 | 0.75% D1 | 2450 |
| 3G | 0.75% C1 | 0.25% D1 | 2280 |
| 3H | 0.5% C1 | 0.5% D1 | 2100 |
| 3I | 0.25% C1 | 0.75% D1 | 1930 |

As is apparent from the results set forth in Table 3, high tungsten removal rates can be achieved using a wide range of mixtures of silica abrasive having a permanent positive charge greater than 10 mV. The polishing rates appear to be highest when the first silica abrasive has a particle size less than about 60 nm when both particles have a permanent positive charge.

Example 4

The tungsten (W) polishing rate was evaluated in this example for various polishing compositions, three of which included first and second silica abrasives selected from dispersions B1 and D in Example 1. This example demonstrates the effects of the relative amounts of the first and second silica abrasives on the W polishing rate. Each of the polishing compositions had a pH of about 2.5 and included 0.031 weight percent ferric nitrate nonahydrate, 0.04 weight percent malonic acid, 2500 ppm glycine, and 2.4 weight percent hydrogen peroxide. The W polishing rates were obtained by polishing eight inch blanket wafers having a W layer using a Mirra® CMP tool (available from Applied Materials) and an IC 1010 polishing pad at down-force of 2.5 psi, a platen speed of 103 rpm, a head speed of 97 rpm, and a slurry flow rate of 150 ml/min. The polishing time in this example was one minute. The weight percents of the first and second silica abrasives and the corresponding W removal rates are shown on Table 4.

TABLE 4

| Polishing Composition | First Abrasive (wt. %) | Second Abrasive (wt. %) | W Polishing Rate (Å/min) |
| --- | --- | --- | --- |
| 4A | 1.0% B1 | | 1740 |
| 4B | 1.0% D1 | | 930 |
| 4C | 0.75% B1 | 0.25% D1 | 1910 |
| 4D | 0.25% B1 | 0.75% D1 | 1720 |
| 4E | 0.5% B1 | 0.5% D1 | 1420 |

As is apparent from the results set forth in Table 4 polishing composition 4C including a mixture of dispersions B1 and D1 achieved a higher W polishing than polishing compositions 4A and 4B including dispersions B1 and D alone.

Example 5

The tungsten (W) polishing rate was evaluated in this example for various polishing compositions, four of which included first and second silica abrasives selected from dispersions B1, B2, and C1 in Example 1. This example demonstrates the effects of the relative amounts of the first and second silica abrasives on the W polishing rate and the time to clear the wafer (the end point time). Each of the polishing compositions had a pH of about 2.5 and included 0.031 weight percent ferric nitrate nonahydrate, 0.04 weight percent malonic acid, 2500 ppm glycine, and 2.4 weight percent hydrogen peroxide. The W polishing rates were obtained by polishing eight inch blanket wafers having a W layer using a Mirra® CMP tool (available from Applied Materials) and an IC 1010 polishing pad at down-force of 2.5 psi, a platen speed of 103 rpm, a head speed of 97 rpm, and a slurry flow rate of 150 ml/min. The polishing time in this example was one minute. The weight percents of the first and second silica abrasives and the corresponding W removal rates and wafer clear time are shown on Table 5.

TABLE 5

| Polishing Composition | First Abrasive (wt. %) | Second Abrasive (wt. %) | W Polishing Rate (Å/min) | Wafer Clear Time (sec) |
| --- | --- | --- | --- | --- |
| 5A | 1.0% C2 | | 1940 | 135 |
| 5B | 0.75% C2 | 0.25% B2 | 2190 | 133 |
| 5C | 0.25% C2 | 0.75% B2 | 2190 | 141 |
| 5D | 0.75% C2 | 0.25% B1 | 2350 | 125 |
| 5E | 0.25% C2 | 0.75% B1 | 2220 | 125 |

As is apparent from the results set forth in Table 5, mixed abrasive polishing compositions 5B and 5C (including mixtures of dispersions B2 and C2) achieved higher W polishing rates than the control composition (5A). Moreover, mixed abrasive polishing compositions 5D and 5E (including mixtures of a colloidal silica having a permanent positive charge (B1) and a colloidal silica having a non-permanent positive charge (C2)) achieved higher W polishing rates than any of the other compositions. Mixed abrasive polishing compositions 5D and 5E were also observed to clear the waver in less time than the other compositions indicating the potential for a higher throughput CMP process.

Example 6

The tungsten (W) polishing rate was evaluated in this example for various polishing compositions, five of which included first and second silica abrasives selected from dispersions B1, D2, and F1 in Example 1. This example demonstrates the effects of the relative amounts of the first and second silica abrasives on the W polishing rate and the time to clear the wafer (the end point time). Each of the polishing compositions had a pH of about 2.5 and included 0.031 weight percent ferric nitrate nonahydrate, 0.04 weight percent malonic acid, and 2.4 weight percent hydrogen peroxide. The W polishing rates were obtained by polishing eight inch blanket wafers having a W layer using a Mirra® CMP tool (available from Applied Materials) and an IC 1010 polishing pad at down-force of 2.5 psi, a platen speed of 103 rpm, a head speed of 97 rpm, and a slurry flow rate of 150 ml/min. The polishing time in this example was two minutes. The weight percents of the first and second silica abrasives and the corresponding W removal rates are shown on Table 6.

TABLE 6

| Polishing Composition | First Abrasive (wt. %) | Second Abrasive (wt. %) | W Polishing Rate (Å/min) | Wafer Clear Time (sec) |
|---|---|---|---|---|
| 6A | 0.8% B1 |  | 3990 | 103 |
| 6B | 0.2% B1 | 0.9% F1 | 5070 | 91 |
| 6C | 0.3% B1 | 0.7% F1 | 5590 | 89 |
| 6D | 0.4% B1 | 0.45% F1 | 5870 | 91 |
| 6E | 0.2% B1 | 0.6% D2 | 5390 | 85 |
| 6F | 0.4% B1 | 0.4% D2 | 5360 | 85 |

As is apparent from the results set forth in Table 6, mixed abrasive polishing compositions 6B, 6C, and 6D (including mixtures of dispersions B1 and F2) achieved higher W polishing rates and a shorter wafer clear time than the control composition 6A. Mixed abrasive polishing compositions 6E and 6F (including mixtures of dispersions B1 and D2) also achieved higher W polishing rates and a shorted wafer clear time than the control composition 6A.

Example 7

The tungsten (W) polishing rate was evaluated in this example for various polishing compositions, six of which included first and second silica abrasives selected from dispersions B1, C1, and D2 in Example 1. This example demonstrates the effects of the relative amounts of the first and second silica abrasives on the W polishing rate and the time to clear the wafer (the end point time). Each of the polishing compositions had a pH of about 2.5 (adjusted using nitric acid) and included 0.031 weight percent ferric nitrate nonahydrate, 0.04 weight percent malonic acid, 100 ppm tetrabutylammonium hydroxide (TBAH), and 2.4 weight percent hydrogen peroxide. The W polishing rates were obtained by polishing eight inch blanket wafers having a W layer using a Mirra® CMP tool (available from Applied Materials) and an IC 1010 polishing pad at down-force of 2.5 psi, a platen speed of 103 rpm, a head speed of 97 rpm, and a slurry flow rate of 150 ml/min. The polishing time in this example was two minutes. The weight percents of the first and second silica abrasives and the corresponding W removal rates are shown on Table 7.

TABLE 7

| Polishing Composition | First Abrasive (wt. %) | Second Abrasive (wt. %) | W Polishing Rate (Å/min) | Wafer Clear Time (sec) |
|---|---|---|---|---|
| 7A | 0.8% B1 |  | 3990 | 103 |
| 7B | 0.2% B1 | 0.3% D2 | 5000 | 85 |
| 7C | 0.2% C1 | 0.3% D2 | 5270 | 88 |
| 7D | 0.1% C1 | 0.1% D2 | 3750 | 100 |
| 7E | 0.1% C1 | 0.3% D2 | 3760 | 96 |
| 7F | 0.2% C1 | 0.1% D2 | 3580 | 96 |
| 7G | 0.15% C1 | 0.2% D2 | 4110 | 97 |

As is apparent from the results set forth in Table 7, polishing compositions 7B and 7D (including mixtures of dispersions B1 and D2 and C1 and D2) achieved higher W polishing rates and shorter wafer clear times than the control composition 7A despite having just over half the solids loading. Polishing compositions 7E, 7F, and 7G (including mixtures of dispersions C1 and D2) achieved approximately equal W polishing rates and shorter wafer clear times than the control composition 7A despite having half or less the solids loading. Polishing composition 7D (including a mixture of dispersions C1 and D2) achieved an approximately equal W polishing rate and wafer clear time as compared to the control composition 7A despite having one quarter the solids loading (0.2 vs. 0.8 weight percent).

Example 8

Zeta potential measurements and conductivity measurements were obtained for various polishing compositions before and after filtration. A 200 ml volume of each composition was filtered (concentrated) through a Millipore Ultracell regenerated cellulose ultrafiltration disk (having a MW cutoff of 100,000 Daltons and a pore size of 6.3 nm). The remaining dispersion (the approximately 65 ml that was retained by the ultrafiltration disk) was collected and replenished to the original 200 ml volume using deionized water adjusted to pH 2.6 with nitric acid. This procedure was repeated for a total of three ultrafiltration cycles (each of which includes an ultrafiltration step and a replenishing step). The zeta-potentials of the polishing compositions were measured before and after the ultrafiltration procedure (i.e., for the original polishing composition and the triply ultra-filtered and replenished polishing composition) using a Model DT 1202 Acoustic and Electro-acoustic spectrometer (available from Dispersion Technologies). The electrical conductivities of the polishing compositions were measured before and after the ultrafiltration procedure using a standard conductivity meter.

Table 8 shows the measured zeta potential and conductivity values for polishing compositions 8A, 8B, 8C, and 8D made from dispersions C1, C2, and D2 described in Example 1. Polishing composition 8A was prepared using dispersion C1 by diluting with DI water to a final colloidal silica concentration of 2 weight percent and adjusting the pH to 2.6 using nitric acid. Polishing composition 8B was prepared using dispersion C2 by diluting with DI water to a final silica concentration of 2 weight percent and adjusting the pH to 2.6 using nitric acid. The colloidal silica was treated using 0.01 weight percent TBAH to obtain particles having a non-permanent positive charge. Polishing composition 8C was prepared using dispersion C2 by diluting with DI water to a final silica concentration of 2 weight percent and adjusting the pH to 2.3 using nitric acid. The colloidal silica particles remained untreated. Polishing composition 8D was prepared by diluting and mixing dispersions C1 and D2 such that the final mixture included 1.2 weight percent of the colloidal silica particles from the C1 dispersion and 0.6 weight percent of the colloidal silica particles from the D2 dispersion. The D2 dispersion was further treated with 0.01 weight percent TBAH to obtain particles having a non-permanent positive charge. Polishing composition 8D further included about 0.031 weight percent ferric nitrate nonahydrate and 0.04 weight percent malonic acid.

As described above, the zeta potential and electrical conductivity of the original compositions were measured before and after the above described ultrafiltration procedure. Corrected zeta-potential values of the triply ultra-filtered and replenished polishing composition (corrected for ionic strength differences as indicated by the conductivity change by the addition of one molar potassium chloride) are also shown. In this example, total solids loss was less than 5 percent and therefore a solids correction was not applied.

TABLE 8

| Polishing Composition | Zeta Potential Before (mV) | Conductivity Before (μs/cm) | Zeta Potential After (mV) | Conductivity After (μs/cm) | Zeta Potential Corrected (mV) |
| --- | --- | --- | --- | --- | --- |
| 8A | 41 | 2130 | 56 | 1156 | 41 |
| 8B | 10 | 1030 | 3 | 1083 | 3 |
| 8C | 4 | | | | |
| 8D | 17 | 3100 | 11 | 3000 | 11 |

As is apparent from the results set forth in Table 8, the zeta potential of polishing composition 8A was not changed by filtration indicating that the colloidal silica had a permanent positive charge of 41 mV. The zeta potential of polishing composition 8B decreased from 10 to 3 mV indicating that the positive charge on the colloidal silica was not permanent. The zeta potential of polishing composition 8C (the untreated colloidal silica particles) was essentially neutral (about 4 mV). The zeta potential of polishing composition 8D decreased modestly from 17 to 11 mV. While not wishing to be bound by theory it is believed that the aminosilane treated particles retained their permanent positive charge (as in polishing composition 8A), while the non-permanent positive charge on the TBAH treated particles is believed to have decreased significantly (as in polishing composition 8B). This combination is believed to have caused the modest decrease in zeta potential.

Example 9

The particle size distribution was evaluated for five polishing compositions prepared using dispersions B1, C1, and D2 from Example 1. Polishing compositions 9A, 9B, and 9C were prepared by diluting dispersions B1, C1, and D2 respectively with DI water to a final colloidal silica concentration of 1 weight percent. Polishing composition 9D was prepared by diluting and mixing dispersions B1 and D2 such that the final mixture included 0.2 weight percent of the colloidal silica particles from the B1 dispersion and 0.3 weight percent of the colloidal silica particles from the D2 dispersion. Polishing composition 9E was prepared by diluting and mixing dispersions C1 and D2 such that the final mixture included 0.2 weight percent of the colloidal silica particles from the C1 dispersion and 0.3 weight percent of the colloidal silica particles from the D2 dispersion. In polishing compositions 9D and 9E, the D2 dispersion was further treated with 100 ppm by weight TBAH to obtain particles having a non-permanent positive charge. Polishing compositions 9D and 9E further included about 193 ppm by weight ferric nitrate nonahydrate, 250 ppm by weight malonic acid, and 7 ppm by weight Kathon biocide. The pH of each of the five polishing compositions (9A, 9B, 9C, 9D, and 9E) was adjusted to 2.5 using nitric acid.

The particle size distribution of each of the polishing compositions was evaluated using a CPS Disc Centrifuge, Model DC24000HR (available from CPS Instruments, Prairieville, La.). A standard gradient was prepared using the CPS Instruments Autogradient (using 8% and 24% sucrose solutions). The particle size distributions are shown on the FIGURE.

As is apparent from the results set forth in the FIGURE, the evaluated polishing compositions have distinct particle size distributions. Polishing composition 9A has a particle size distribution with a peak at about 50 nm. Polishing composition 9B has a particle size distribution with a peak at about 70 nm. Polishing composition 9C has a particle size distribution with a peak at about 115 nm. Polishing composition 9D has a bimodal distribution with a first peak at about 50 nm and a second peak at about 115 nm. Polishing composition 9E has a bimodal distribution with a first peak at about 75 nm and a second peak at about 110 nm.

It will be understood that the recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical mechanical polishing composition comprising:
   a water based liquid carrier;
   a first colloidal silica abrasive dispersed in the liquid carrier, the first colloidal silica abrasive having a permanent positive charge of at least 10 mV;
   a second colloidal silica abrasive dispersed in the liquid carrier, the second colloidal silica abrasive having a permanent positive charge of at least 10 mV; and
   an iron containing accelerator;
   wherein an average particle size of the second colloidal silica abrasive is at least 20 nanometers greater than an average particle size of the first colloidal silica abrasive, and wherein the first colloidal silica abrasive and the second colloidal silica abrasive comprise colloidal silicas in which 50 percent or more of the colloidal silica abrasive particles include two or more aggregated primary particles.

2. The composition of claim 1, wherein each of the first colloidal silica abrasive and the second colloidal silica abrasive have a permanent positive charge of at least 20 mV.

3. The composition of claim 1, wherein each of the first colloidal silica abrasive and the second colloidal silica abrasive is treated with an aminosilane compound.

4. The composition of claim 3, wherein the aminosilane compound is a propyl group containing aminosilane.

5. The composition of claim 3, wherein the aminosilane compound is selected from the group consisting of such as bis(2-hydroxyethyl)-3-aminopropyl trialkoxysilane, diethylaminomethyltrialkoxysilane, (N,N-diethyl-3-aminopropyl) trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium chloride, N-(trialkoxysilylethyl)benzyl-N,N,N-trimethyl ammonium chloride, (bis(methyldialkoxysilylpropyl)-N-methyl amine, bis(trialkoxysilylpropyl)urea, bis(3-(trialkoxysilyl)propyl)-ethylenediamine, bis(trialkoxysilylpropyl)amine, bis(trialkoxysilylpropyl)amine, and mixtures thereof.

6. The composition of claim 1, wherein:
the average particle size of the first colloidal silica abrasive is in a range from about 20 to about 110 nanometers; and
the average particle size of the second colloidal silica abrasive is in a range from about 90 to about 180 nanometers.

7. The composition of claim 1, having a pH in a range from about 1.5 to about 5.

8. The composition of claim 1, wherein the iron containing accelerator comprises a soluble iron containing catalyst and the composition further comprises a stabilizer bound to the soluble iron containing catalyst, the stabilizer being selected from the group consisting of acetic acid, phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

9. The composition of claim 1, further comprising a hydrogen peroxide oxidizer.

10. The composition of claim 1, further comprising a tungsten etching inhibitor including an amine containing compound.

11. The method of claim 1, wherein the iron containing accelerator comprises a soluble iron containing catalyst and the polishing composition further comprises a stabilizer bound to the soluble iron containing catalyst, the stabilizer being selected from the group consisting of acetic acid, phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof.

12. The method of claim 1, wherein the polishing composition further comprises a hydrogen peroxide oxidizer.

13. The method of claim 1, wherein the polishing composition further comprises a tungsten etching inhibitor including an amine containing compound.

14. A method of chemical mechanical polishing a substrate including a tungsten layer, the method comprising:
(a) contacting the substrate with a polishing composition comprising:
(i) a water based liquid carrier;
(ii) a first colloidal silica abrasive dispersed in the liquid carrier, the first colloidal silica abrasive having a permanent positive charge of at least 10 mV;
(iii) a second colloidal silica abrasive dispersed in the liquid carrier, the second colloidal silica abrasive having a permanent positive charge of at least 10 mV; and
(iv) an iron containing accelerator;
wherein an average particle size of the second colloidal silica abrasive is at least 20 nanometers greater than an average particle size of the first colloidal silica abrasive, wherein the first colloidal silica abrasive and the second colloidal silica abrasive comprise colloidal silicas in which 50 percent or more of the colloidal silica abrasive particles include two or more aggregated primary particles;
(b) moving the polishing composition relative to the substrate; and
(c) abrading the substrate to remove a portion of the tungsten from the substrate and thereby polish the substrate.

15. The method of claim 14, wherein each of the first colloidal silica abrasive and the second colloidal silica abrasive is treated with a propyl group containing aminosilane compound.

16. The method of claim 14, wherein:
the average particle size of the first colloidal silica abrasive is in a range from about 20 to about 110 nanometers; and
the average particle size of the second colloidal silica abrasive is in a range from about 90 to about 180 nanometers.

17. The method of claim 14, wherein the polishing composition has a pH in a range from about 1.5 to about 5.

* * * * *